(12) United States Patent
Lee et al.

(10) Patent No.: US 11,429,223 B2
(45) Date of Patent: Aug. 30, 2022

(54) DISPLAY DEVICE HAVING TOUCH SENSOR

(71) Applicant: LG Display Co., Ltd., Seoul (KR)

(72) Inventors: Jae-Gyun Lee, Paju-si (KR); Ji-Hyun Jung, Paju-si (KR); Su-Chang An, Seoul (KR); Ru-Da Rhe, Seoul (KR); Hyang-Myoung Gwon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/241,830

(22) Filed: Apr. 27, 2021

(65) Prior Publication Data

US 2021/0247886 A1 Aug. 12, 2021

Related U.S. Application Data

(62) Division of application No. 16/512,212, filed on Jul. 15, 2019, now Pat. No. 11,023,074.

(30) Foreign Application Priority Data

Jul. 16, 2018 (KR) .......................... 10-2018-0082202

(51) Int. Cl.
*G06F 3/041* (2006.01)
*G06F 3/044* (2006.01)
*H01L 27/32* (2006.01)
*H01L 51/52* (2006.01)

(52) U.S. Cl.
CPC ........ *G06F 3/04164* (2019.05); *G06F 3/0412* (2013.01); *G06F 3/0446* (2019.05); *G06F 3/0448* (2019.05); *H01L 27/322* (2013.01); *H01L 27/323* (2013.01); *H01L 27/3246* (2013.01); *H01L 51/5253* (2013.01); *H01L 51/5284* (2013.01); *G06F 2203/04111* (2013.01); *G06F 2203/04112* (2013.01)

(58) Field of Classification Search
None
See application file for complete search history.

(56) References Cited

U.S. PATENT DOCUMENTS

| | | | |
|---|---|---|---|
| 2012/0268402 A1* | 10/2012 | Wang | G06F 3/0443 345/173 |
| 2015/0206501 A1* | 7/2015 | Kurasawa | G02F 1/133553 345/206 |
| 2016/0170523 A1 | 6/2016 | Park et al. | |
| 2017/0199611 A1* | 7/2017 | Brunet | G06F 3/041662 |
| 2019/0018530 A1* | 1/2019 | Lee | G06F 3/0443 |
| 2019/0018540 A1* | 1/2019 | Ko | G06F 3/0446 |
| 2019/0042021 A1 | 2/2019 | Hong et al. | |
| 2019/0302959 A1* | 10/2019 | Clark | G06F 3/0443 |

FOREIGN PATENT DOCUMENTS

| | | |
|---|---|---|
| WO | 2016/085116 A1 | 6/2016 |
| WO | 2018/099174 A1 | 6/2018 |

* cited by examiner

*Primary Examiner* — Duane N Taylor, Jr.
(74) *Attorney, Agent, or Firm* — Seed IP Law Group LLP

(57) ABSTRACT

A display device having a touch sensor that enables the size of a bezel area to be reduced is disclosed. The display device is configured such that a display area is spatially divided into first and second touch areas, and first sensing-routing lines, connected to touch electrodes in the first touch area, and second sensing-routing lines, connected to touch electrodes in the second touch area, are not disposed in side and upper bezel areas but are alternately disposed in a lower bezel area. Consequently, it is possible to reduce the size of the side bezel area and the upper bezel area.

11 Claims, 12 Drawing Sheets

DISPLAY DEVICE HAVING TOUCH SENSOR

This application is a divisional of U.S. patent application Ser. No. 16/512,212, filed on Jul. 15, 2019 which claims the benefit of Korean Patent Application No. 10-2018-0082202, filed on Jul. 16, 2018, which is hereby incorporated by reference as if fully set forth herein.

BACKGROUND

Technical Field

The present disclosure relates to a display device, and more particularly to a display device having a touch sensor that enables the size of a bezel area to be reduced.

Description of the Related Art

A touchscreen is an input device that allows a user to input a command by selecting one of multiple instructions displayed on a screen, such as that of a display device, using a user's hand or an object. That is, the touchscreen converts the contact position, at which the user's hand or the object directly contacts the touchscreen, into an electrical signal to receive the instruction selected at the contact position as an input signal. Use of such a touchscreen has been increasing, since the touchscreen is capable of replacing a separate input device that is connected to the display device for operation, such as a keyboard or a mouse.

In the case in which the touchscreen is applied to a large-area display panel, the number of touch electrodes is increased, whereby the number of routing lines for connecting the touch electrodes to a touch-driving IC is also increased. As a result, the size of a non-display area, in which the routing lines are disposed, i.e., a bezel area, is increased.

BRIEF SUMMARY

Accordingly, various embodiments of the present disclosure is directed to a display device having a touch sensor that substantially obviates one or more problems due to the limitations and disadvantages of the related art.

Various embodiments of the present disclosure provide a display device having a touch sensor that enables the size of a bezel area to be reduced.

Additional advantages and features of the present disclosure will be set forth in part in the description which follows and in part will become apparent to those having ordinary skill in the art upon examination of the following, or may be learned from practice of the various embodiments of the present disclosure. Other advantages of the embodiments of the present disclosure may be realized and attained by the structure particularly pointed out in the written description and claims hereof as well as the appended drawings.

To achieve these advantages, in accordance with various embodiments described herein, a display device having a touch sensor is configured such that a display area is spatially divided into first and second touch areas; and first sensing-routing lines, connected to touch electrodes in the first touch area, and second sensing-routing lines, connected to touch electrodes in the second touch area, are not disposed in a side or upper bezel area but are alternately disposed in a lower bezel area, whereby it is possible to reduce the size of the side bezel area and the upper bezel area.

It is to be understood that both the foregoing general description and the following detailed description of the present disclosure are exemplary and explanatory and are intended to provide further explanation of the various embodiments of the present disclosure as claimed.

BRIEF DESCRIPTION OF THE SEVERAL VIEWS OF THE DRAWINGS

The accompanying drawings, which are included to provide a further understanding of the various embodiments of the present disclosure and are incorporated in and constitute a part of this application, illustrate embodiment(s) of the present disclosure and together with the description serve to explain principles of the present disclosure. In the drawings.

DETAILED DESCRIPTION

Hereinafter, exemplary embodiments of an organic light-emitting display device according to the present disclosure will be described in detail with reference to the accompanying drawings so that the present disclosure will be easily realized by those skilled in the art.

Figure 1:
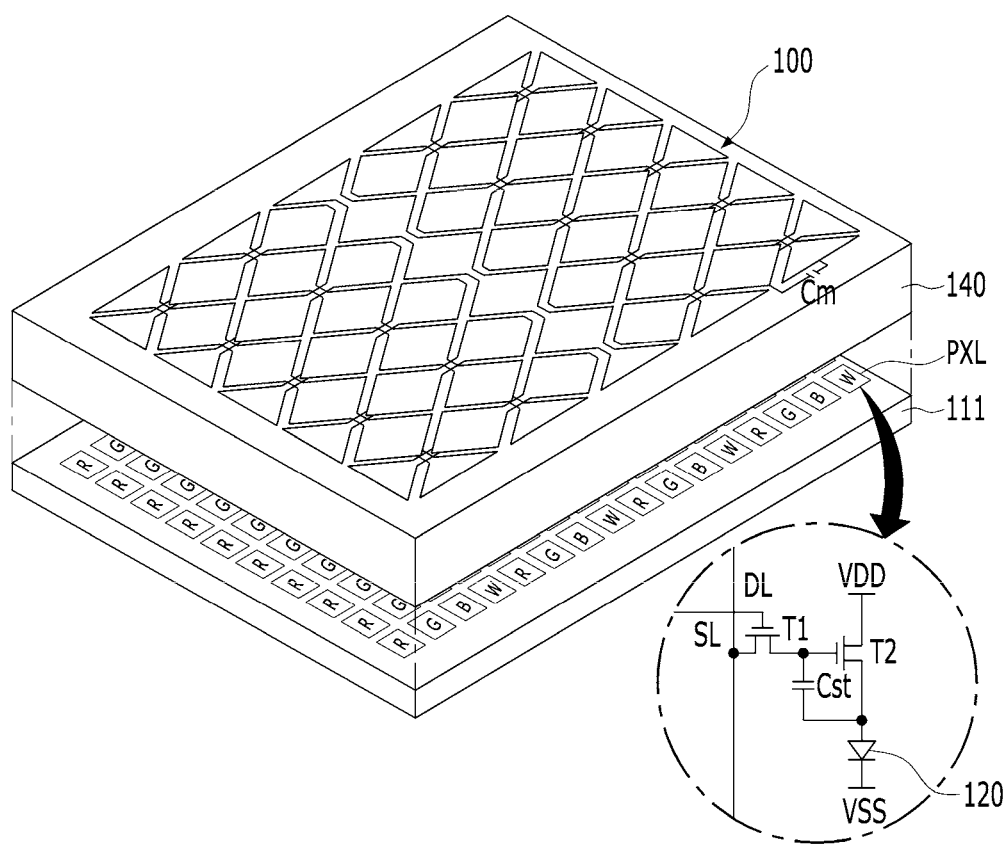
FIG. 1 is a perspective view showing a display device having a touch sensor according to one embodiment the present disclosure.
Figure 2:
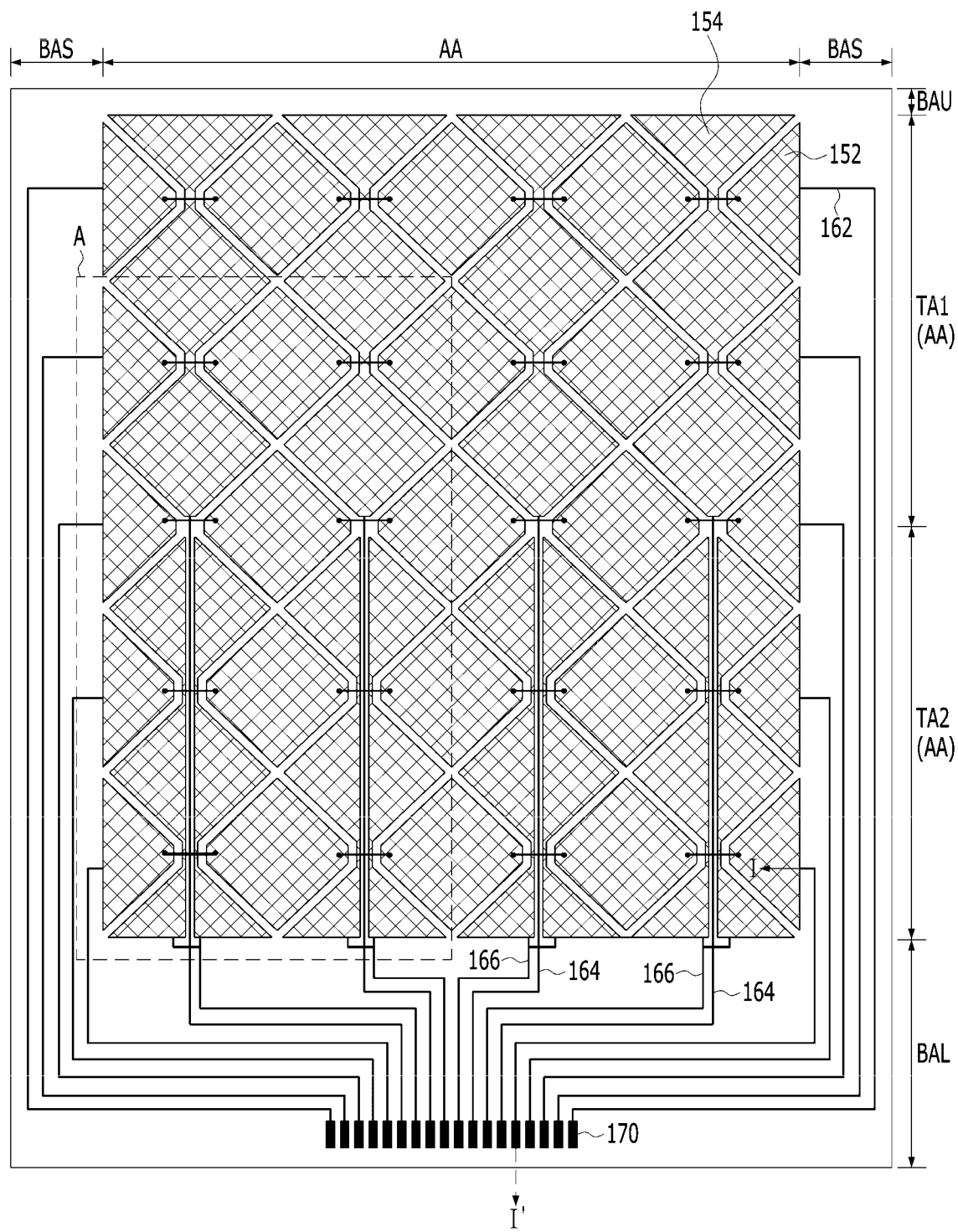
FIG. 2 is a plan view showing, in detail, the display device having the touch sensor shown in FIG. 1.
Figure 3:
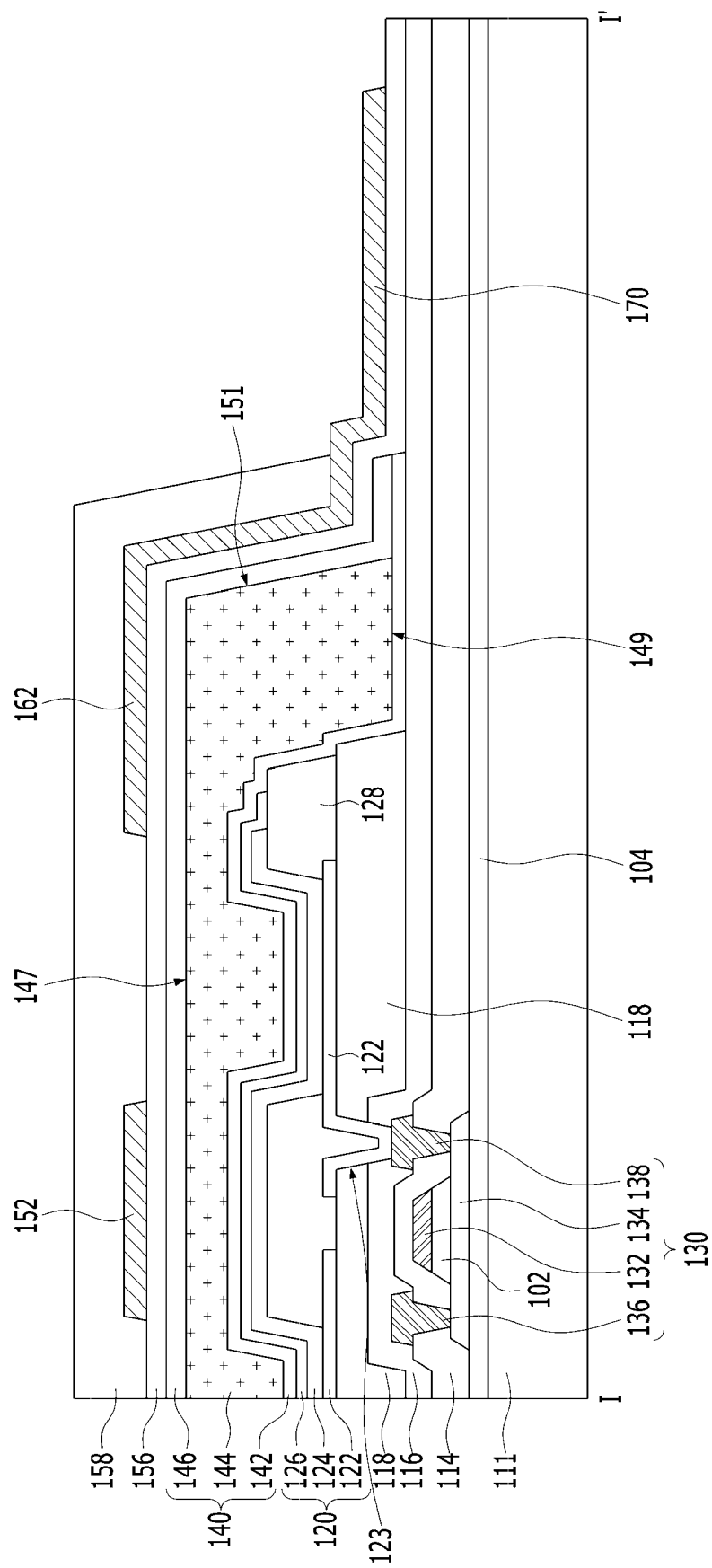
FIG. 3 is a sectional view of the display device having the touch sensor taken along line I-I of FIG. 2.
Figure 4:
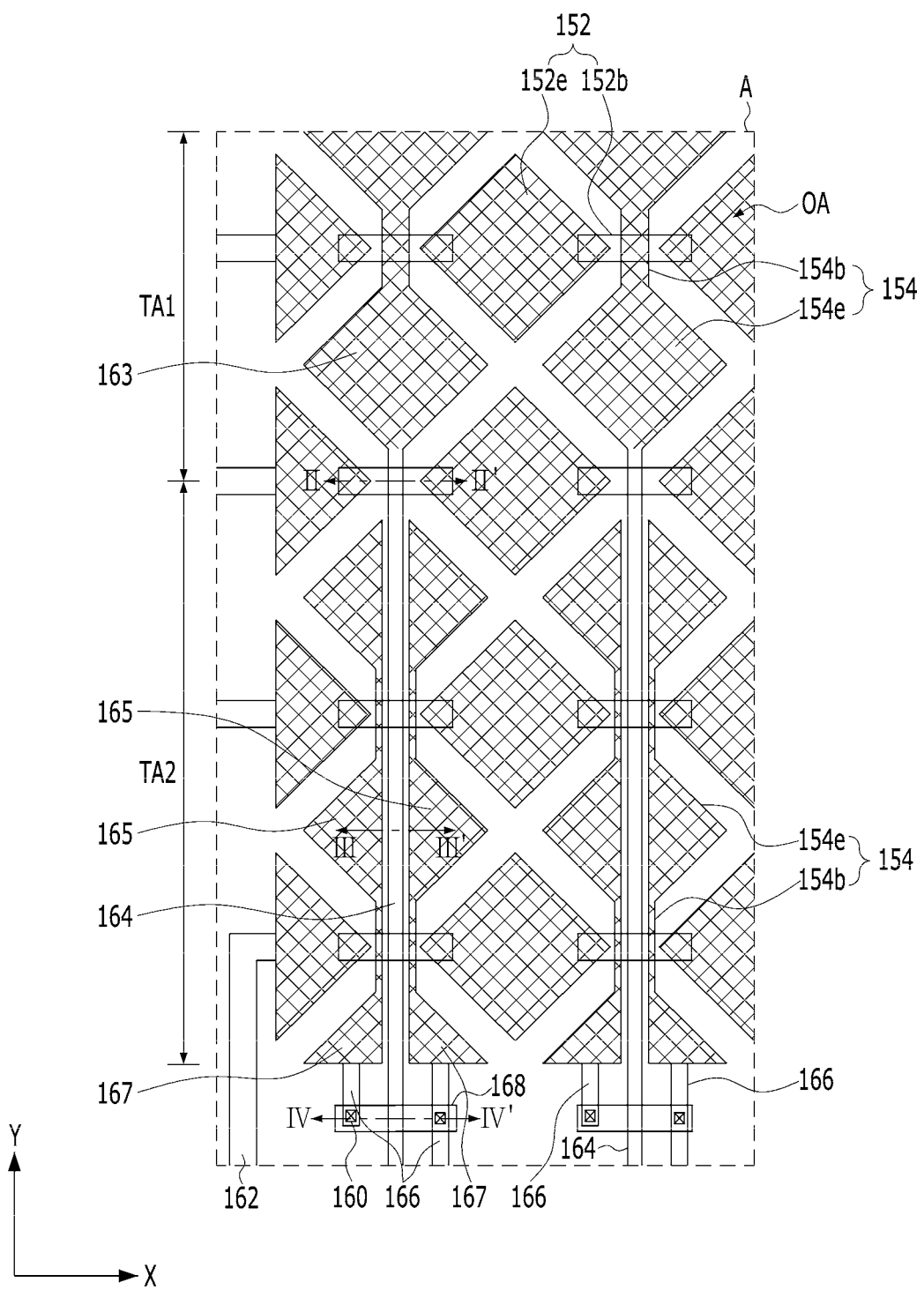
FIG. 4 is a plan view showing, in detail, area A of FIG. 2.
Figure 5A:
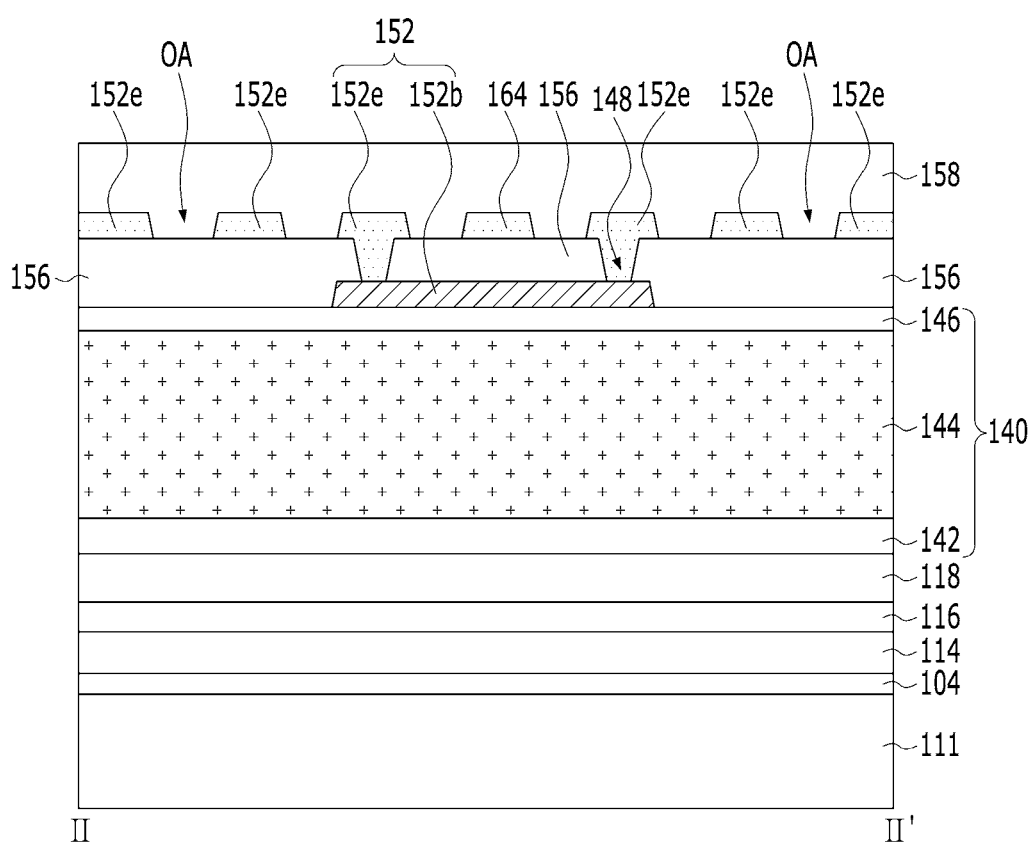
FIG. 5A is a sectional view of the display device having the touch sensor taken along line II-II of FIG. 4.
Figure 5B:
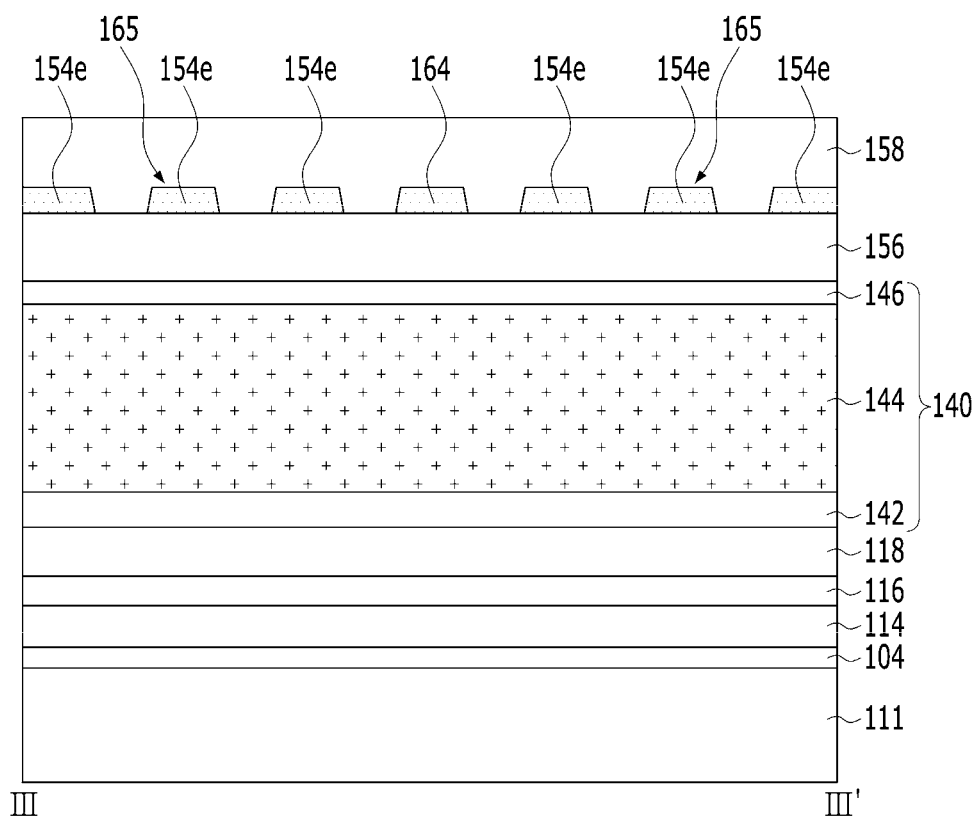
FIG. 5B is a sectional view of the display device having the touch sensor taken along line III-III of FIG. 4.
Figure 5C:
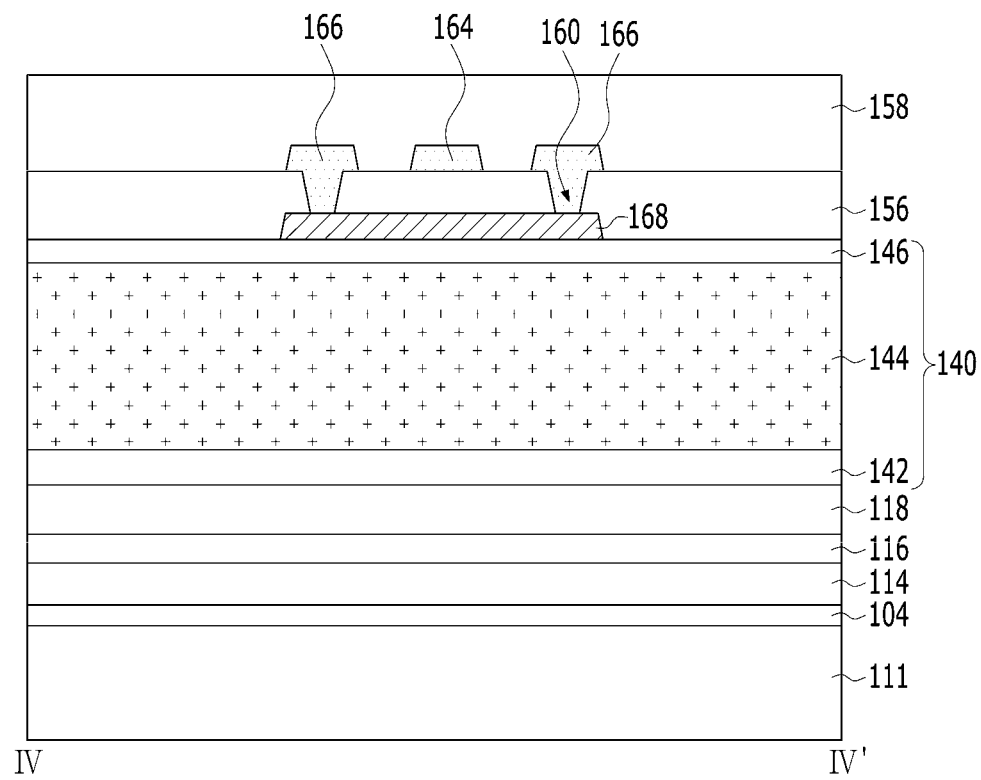
FIG. 5C is a sectional view of the display device having the touch sensor taken along line IV-IV of FIG. 4.

FIG. 1 is a perspective view showing an organic light-emitting display device having a touch sensor according to one embodiment the present disclosure. FIG. 2 is a plan view showing, in detail, the display device having the touch sensor shown in FIG. 1. FIG. 3 is a sectional view of the display device having the touch sensor taken along line I-I of FIG. 2. FIG. 4 is a plan view showing, in detail, area A of FIG. 2. FIG. 5A is a sectional view of the display device having the touch sensor taken along line II-II of FIG. 4. FIG. 5B is a sectional view of the display device having the touch sensor taken along line III-III of FIG. 4. FIG. 5C is a sectional view of the display device having the touch sensor taken along line IV-IV of FIG. 4. It is beneficial to review FIGS. 1, 2, 3, and 4 together.

The organic light-emitting display device having the touch sensor shown in FIG. 1 includes a plurality of subpixels PXL arranged on a substrate 111 in the form of a matrix, an encapsulation unit 140 disposed on the subpixels PXL, and a touch sensor 100 disposed on the encapsulation unit 140. In one embodiment, the encapsulation unit 140 is structure that includes one or more layers of material.

As shown in FIG. 2, the organic light-emitting display device having the touch sensor is divided into an active area AA, provided on the substrate 111, and bezel areas BAU, BAL, and BAS, which is an inactive area disposed around the active area AA. In one embodiment, as shown in FIG. 2, the bezel areas BAU, BAL, and BAS, together, encircle the active area AA. As will be described in further detail below, the active area AA includes touch-driving lines 152 and touch-sensing lines 154, and the bezel areas BAU, BAL, and BAS include routing lines and do not include touch-driving lines 152 and touch-sensing lines 154. It is noted that the organic light-emitting display device may include any number of columns of touch-sensing lines 154 and rows of touch-driving lines 152. For example, in FIG. 1, the organic light-emitting display device includes five columns of touch-sensing lines and five rows of touch-driving lines. As another example, in FIG. 2, the organic light-emitting display device includes four columns of touch-sensing lines and five rows of touch-driving lines. In one embodiment, the substrate 111 is made of a glass material or a plastic material having flexibility so as to be folded or bent. For example, in one embodiment, the substrate 111 is made of one or more of polyimide (PI), polyethylene terephthalate (PET), polyethylene naphthalate (PEN), polycarbonate (PC), polyethersulfone (PES), polyarylate (PAR), polysulfone (PSF), or cyclic-olefin copolymer (COC).

The active area displays an image through unit pixels arranged in the form of a matrix. Each unit pixel may include red, green, and blue subpixels, or may include red, green, blue, and white subpixels.

As shown in FIGS. 1 and 3, each subpixel includes a pixel-driving circuit, which includes a plurality of transistors T1 and T2 and a storage capacitor Cst, and a light-emitting element 120 connected to the pixel-driving circuit.

A driving transistor 130, which is included in the pixel-driving circuit, controls the current supplied from a high-voltage supply line to the light-emitting element 120 in response to a data signal supplied to a gate electrode of the driving transistor 130, in order to adjust the amount of light that is emitted by the light-emitting element 120.

As shown in FIG. 3, the driving thin film transistor 130 includes a semiconductor layer 134 disposed on a buffer layer 104, a gate electrode 132 overlapping the semiconductor layer 134 in the state in which a gate dielectric film 102 is disposed therebetween, and source and drain electrodes 136 and 138 formed on and through an interlayer dielectric film 114 so as to contact the semiconductor layer 134. In one embodiment, the semiconductor layer 134 is made of at least one of an amorphous semiconductor material, a polycrystalline semiconductor material, or an oxide semiconductor material.

The light-emitting element 120 includes an anode electrode 122, at least one light-emitting stack 124 formed on the anode electrode 122, and a cathode electrode 126 formed on the light-emitting stack 124.

The anode electrode 122 is electrically connected to the drain electrode 138 of the driving thin film transistor 130, which is exposed through a pixel contact hole 123 formed through a passivation film 116 and a pixel planarization layer 118.

The at least one light-emitting stack 124 is formed on the anode electrode 122 in a light-emitting area defined by a bank 128. The at least one light-emitting stack 124 is formed by stacking, sequentially or reversely, a hole-related layer, an organic light-emitting layer, and an electron-related layer on the anode electrode 122. In addition, the light-emitting stack 124 may include first and second light-emitting stacks opposite each other in the state in which a charge generation layer is disposed therebetween. In this case, the organic light-emitting layer of one of the first and second light-emitting stacks generates blue light, and the organic light-emitting layer of the other of the first and second light-emitting stacks generates yellow-green light, whereby white light is generated through the first and second light-emitting stacks. The white light generated by the light-emitting stack 124 is incident on a color filter located above or below the light-emitting stack 124, whereby a color image may be realized. In addition, each light-emitting stack 124 may generate color light corresponding to each subpixel without a color filter in order to realize a color image. That is, the light-emitting stack 124 of the red subpixel may generate red light, the light-emitting stack 124 of the green subpixel may generate green light, and the light-emitting stack 124 of the blue subpixel may generate blue light.

The cathode electrode 126 is formed so as to be opposite the anode electrode 122 in the state in which the light-emitting stack 124 is disposed therebetween, and is connected to a low-voltage supply line. Stated differently, the light-emitting stack 124 is on the anode electrode 122, and the cathode electrode 126 is on the light-emitting stack 124.

The encapsulation unit 140 prevents external moisture or oxygen from permeating into the light-emitting element 120, which has low resistance to external moisture or oxygen. To this end, the encapsulation unit 140 includes at least one inorganic encapsulation layer 142 and at least one organic encapsulation layer 144. In the present disclosure, the structure of the encapsulation unit 140 in which a first inorganic encapsulation layer 142, an organic encapsulation layer 144, and a second inorganic encapsulation layer 146 are sequentially stacked will be described by way of example.

The first inorganic encapsulation layer 142 is formed on the substrate 111, on which the cathode electrode 126 is formed. The second inorganic encapsulation layer 146 is formed on the substrate 111, on which the organic encapsulation layer 144 is formed, and is formed so as to surround the upper surface 147, the lower surface 149, and the side surface 151 of the organic encapsulation layer 144 together with the first inorganic encapsulation layer 142.

The first and second inorganic encapsulation layers 142 and 146 minimize or prevent external moisture or oxygen from permeating into the light-emitting stack 124. In one embodiment, each of the first and second inorganic encapsulation layers 142 and 146 is made of an inorganic dielectric material that is capable of being deposited at a low temperature, such as silicon nitride (SiNx), silicon oxide (SiOx), silicon oxide nitride (SiON), or aluminum oxide ($Al_2O_3$). Since the first and second inorganic encapsulation layers 142 and 146 are deposited in a low-temperature atmosphere, it is possible to prevent damage to the light-emitting stack 124, which has low resistance to a high-temperature atmosphere, during the process of depositing the first and second inorganic encapsulation layers 142 and 146.

The organic encapsulation layer 144 serves as a buffer for alleviating stress between the respective layers generated due to bending of the organic light-emitting display device, and strengthens a planarization function. The organic encapsulation layer 144 is formed on the substrate 111, on which the first inorganic encapsulation layer 142 is formed. In one embodiment, the organic encapsulation layer 144 is made of a non-photosensitive organic dielectric material, such as PCL, an acrylic resin, an epoxy resin, polyimide, polyethylene, or silicon oxycarbide (SiOC), or a photosensitive organic dielectric material, such as photo acrylic. The organic encapsulation layer 144 is disposed in the active area AA, excluding the bezel area BAU, BAL, and BAS, which is the inactive area.

Referring to FIG. 1, mutual capacitance Cm is formed in the active area AA of the encapsulation unit 140. The mutual capacitance Cm charges an electric charge according to a touch-driving pulse supplied to a touch-driving line 152 and discharges the charged electric charge according to a touch-sensing line 154, thereby serving as a touch sensor. In the case in which the touch sensor 100 is applied to a large-area organic light-emitting display panel, the number of touch sensors is increased. In order to realize the increased number of touch sensors as a plurality of chips or to increase the touch response speed thereof, the touch sensor 100 disposed on the encapsulation unit 140 is spatially divided into a plurality of touch areas. In the present disclosure, the structure in which a first touch area TA1, which is distant from touch pads 170, and a second touch area TA2, which is closer to the touch pads 170 than the first touch area TA1, are disposed on the second inorganic encapsulation layer 146, as shown in FIG. 2, will be described by way of example. It is noted, however, the organic light-emitting display device may have any number of touch areas. As best shown in FIG. 2, the first touch area TA1 and the second touch area TA2 are sub areas of the active area AA.

A touch-sensing line 154 and a touch-driving line 152, which form mutual capacitance Cm together with the touch-sensing line 154, are disposed in each of the first and second touch areas TA1 and TA2.

Referring to FIG. 4, the touch-driving line 152, which is included in each of the first and second touch areas TA1 and TA2, includes a plurality of first touch electrodes 152e and first bridges 152b for electrically connecting the first touch electrodes 152e to each other.

As shown in FIGS. 4 and 5A, the first touch electrodes 152e are spaced apart from each other by a predetermined distance in the X direction, which is the first direction, on a touch dielectric film 156. The first touch electrodes 152e are formed in a mesh shape with a plurality of opening areas OA. The mesh-shaped first touch electrodes 152e correspond to banks 128 of the respective subpixels, and the opening areas OA between the mesh-shaped first touch electrodes 152e correspond to the light-emitting areas of the respective subpixels. Stated differently, as best shown in FIG. 5A, the mesh-shaped first touch electrodes 152e, themselves, directly overlie the banks 128 of the respective subpixels, and the opening areas OA directly overlie the light-emitting areas of the respective subpixels. Each of the first touch electrodes 152e is electrically connected to a first touch electrode 152e adjacent thereto via a corresponding one of the first bridges 152b.

Referring to FIG. 5A, the first bridges 152b are disposed on the second inorganic encapsulation layer 146, and are exposed through touch contact holes 148 formed through the touch dielectric film 156 so as to be electrically connected to the first touch electrodes 152e. Since the first bridges 152b are disposed so as to overlap the banks 128, it is possible to prevent the reduction of the aperture ratio caused by the first bridges 152b.

As shown in FIG. 2, the touch-driving lines 152 are electrically connected to the touch pads 170 via driving-routing lines 162. The driving-routing lines 162 extend from the touch-driving line 152; through the side bezel area BAS, which is disposed at the left side and the right side of the active area AA, and to the touch pads 170. The driving-routing lines 162 bypass the side bezel area BAS, which is disposed at the left side and the right side of the active area AA, and are electrically connected to the touch pads 170, which are located in the lower bezel area BAL. The touch pads 170 may sometimes be referred to as contact pads.

Referring to FIG. 4, the touch-sensing line 154, which is included in each of the first and second touch areas TA1 and TA2, includes a plurality of second touch electrodes 154e and second bridges 154b for electrically connecting the second touch electrodes 154e to each other.

The second bridges 154b, which are disposed in each of the first and second touch areas TA1 and TA2, are disposed on the touch dielectric film 156. In one embodiment, the second bridges 154b are in the same plane as (i.e., coplanar with) the second touch electrodes 154e, and are electrically connected to the second touch electrodes 154e without separate contact holes. Since the second bridges 154b are disposed so as to overlap the banks 128, in the same manner as first bridges 154b, it is possible to prevent the reduction of the aperture ratio caused by the second bridges 154b.

The second bridges 154b disposed in the first and second touch areas TA1 and TA2 are formed so as to have different shapes. That is, each of the second bridges 154b disposed in the second touch area TA2 is formed in a shape obtained by dividing each of the second bridges 154b disposed in the first touch area TA1 into two parts. As shown in FIGS. 4 and 5B, therefore, the second bridges 154b disposed in the second touch area TA2 are formed so as to be symmetrical to each other in the state in which first sensing-routing lines 164 are disposed therein. Stated differently, each of the second bridges 154b mirror another one of the second bridges 154b with respect to one of the first sensing-routing lines 164. The second bridges 154b disposed in the second touch area TA2 are connected to the second touch electrodes 154e, which are spaced apart from each other in the Y direction by the second bridges 154b and spaced apart from each other in the X direction by the first sensing-routing lines 164.

The second touch electrodes 154e are spaced apart from each other by a predetermined distance on the touch dielectric film 156 in the Y direction, which is the second direction. The second touch electrodes 154e are formed in a mesh shape with a plurality of opening areas OA. The mesh-shaped second touch electrodes 154e correspond to the banks 128 of the respective subpixels, and the opening areas OA between the mesh-shaped second touch electrodes 154e correspond to the light-emitting areas of the respective subpixels. Stated differently, the mesh-shaped second touch electrodes 154e, themselves, directly overlie the banks 128 of the respective subpixels, and the opening areas OA directly overlie the light-emitting areas of the respective subpixels. Each of the second touch electrodes 154e is electrically connected to a second touch electrode 154e adjacent thereto via a corresponding one of the second bridges 154b.

In the same manner as the first touch electrodes 152e, the second touch electrodes 154e disposed in the first touch area TA1 are formed in a diamond shape. The lowermost second touch electrodes 163, among the second touch electrodes 154e disposed in the first touch area TA1, are connected to the touch pads 170 through the first sensing-routing lines 164. The first sensing-routing lines 164 are disposed so as to cross the second touch area TA2 while overlapping the first bridges 152b disposed in the second touch area TA2 in the state in which the touch dielectric film 156 is disposed therebetween, and thus extend to the lower bezel area BAL, in which the touch pads 170 are disposed. In one embodiment, the first sensing-routing lines 164 have the same length in the second touch area TA2, and the first sensing-routing lines 164 are formed so as to have the same line width or different line widths in the second touch area TA2 and the lower bezel area BAL. In one embodiment, since the first sensing-routing lines 164 are disposed between the divided second touch electrodes 154e, the line width of the first sensing-routing lines 164 in the second touch area TA2 is smaller than the line width of the first sensing-routing lines 164 in the lower bezel area BAL in order to prevent a short circuit with the second touch electrodes 154e. Since the first sensing-routing lines 164 are disposed so as to cross the second touch area TA2 of the active area AA, the first sensing-routing lines 164 are not disposed in the upper and side bezel areas BAU and BAS. Consequently, it is possible to reduce the total number of routing lines 162, 164, and 166 disposed in the upper and side bezel areas BAU and BAS, whereby it is possible to reduce the size of the upper and side bezel areas BAU and BAS.

The second touch electrodes 154e disposed in the second touch area TA2 are disposed so as to be electrically isolated and physically separated from the second touch electrodes 154e disposed in the first touch area TA1. Each of the second touch electrodes 154e disposed in the second touch area TA2 is formed so as to have a different shape than each of the second touch electrodes 154e disposed in the first touch area TA1. As shown in FIGS. 4 and 5B, the second touch electrodes 154e disposed in the second touch area TA2 are formed so as to be symmetrical to each other in the state in which the first sensing-routing lines 164 are disposed therein. Stated differently, each of the second touch electrodes 154e mirror another one of the second touch electrodes 154e with respect to one of the first sensing-routing lines 164. That is, each of the second touch electrodes 154e disposed in the second touch area TA2 is formed in a shape obtained by dividing each of the second touch electrodes 154e disposed in the first touch area TA1 into two parts 165. Consequently, each of the two parts 165 of the second touch electrodes 154e disposed in the second touch area TA2 is formed in a triangular shape, and the triangular second touch electrodes 154e are spaced apart from each other in the state in which the first sensing-routing lines 164 are disposed therebetween. In one embodiment, the two parts 165 have the same size and shape. In one embodiment, each of the two parts 165 is smaller than each of the second touch electrodes 154e disposed in the first touch area TA1. The lowermost second touch electrodes 167, among the second touch electrodes 154e disposed in the second touch area TA2, are connected to the touch pads 170 through second sensing-routing lines 166. The second sensing-routing lines 166 extend from the lowermost second touch electrodes 167; through the bezel area BA, which is disposed at the lower side of the active area AA; and to the touch pads 170.

As shown in FIG. 2, the two divided second touch electrodes 154e in the second touch area TA2 are electrically connected to the touch pads 170 via the second sensing-routing lines 166. As shown in FIGS. 4 and 5C, the second sensing-routing lines 166, which are electrically connected to the two divided second touch electrodes 154e, are electrically connected to each other via connection electrodes 168 in the lower bezel area BAL. In one embodiment, the second sensing-routing lines 166 are made of the same material as the second bridges 154b. In one embodiment, the first and second touch electrodes 152e and 154e, the first sensing-routing lines 164, and the driving-routing lines 162, and are disposed in the same plane as (i.e., coplanar with) the second bridges 154b, the first and second touch electrodes 152e and 154e, the first sensing-routing lines 164, and the driving-routing lines 162. Since the second sensing-touting lines 166 are formed through the same mask process as the second bridges 154b, the first and second touch electrodes 152e and 154e, the first sensing-routing lines 164, and the driving-routing lines 162, the second sensing-routing lines 166 may be made of the same material as the second bridges 154b, the first and second touch electrodes 152e and 154e, the first sensing-routing lines 164, and the driving-routing lines 162, are disposed on the touch dielectric film 156. Since the connection electrodes 168 are formed through the same mask process as the first bridges 152b, the connection electrodes 168 may be made of the same material as the first bridges 152b, and are disposed on the second inorganic encapsulation layer 146. Referring to FIGS. 4 and 5C, the second sensing-routing lines 166 are electrically connected to the connection electrodes 167 via a contact hole 160.

In one embodiment, display pads connected to signal lines for driving the pixel-driving circuits and the light-emitting elements 120, the touch pads 170, the driving-routing lines 162, and the first and second sensing-routing lines 164 and 166 are disposed in the bezel area BA.

In one embodiment, the display pads and the touch pads 170 are disposed in the bezel area BAU, BAS, and BAL on at least one of a one-side area or an other-side area of the substrate 111. In one embodiment, the display pads and the touch pads 170 are disposed in a single area of the bezel areas BAU, BAS, and BAL. In one embodiment, the touch pads 170 and the display pads are disposed in different areas of the bezel areas BAU, BAS, and BAL. In one embodiment, the bezel area BAU, BAS, and BAL, in which the touch pads 170 and the display pads are disposed, may be bent so as to be located at the rear surface of the active area AA. Stated differently, in one embodiment, the touch pads 170 and the display pads are positioned on a first surface of the substrate 111; and the touch-driving line 152 touch-sensing line 154 are positioned on a second surface, opposite to the first surface, of the substrate 111. Consequently, the area that is occupied by the active area in the entire screen of the display device is maximized, and the area corresponding to the bezel area BAU, BAS, and BAL is minimized. Meanwhile, the touch pads 170 and the display pads are not limited to the structure of FIG. 2, and may be variously changed depending on the specification of the display device.

The touch pads 170 and the display pads are disposed on at least one display dielectric film of the buffer layer 104, the interlayer dielectric film 114, or the pixel planarization layer 118, which are disposed between the substrate 111 and the encapsulation unit 140; or on the touch dielectric film 156. The touch pads 170 are formed so as to be exposed by a touch passivation film 158 together with the driving and sensing-routing lines 162, 164, and 166, and thus are connected to a signal transmission film on which a touch-driving unit is mounted. Here, the touch passivation film 158 is formed so as to cover the touch-sensing line 154 and the touch-driving line 152 in order to prevent the touch-sensing line 154 and the touch-driving line 152 from being corroded by external moisture. In one embodiment, the touch passivation film 158 is made of an organic dielectric material, such as epoxy or acrylic. In one embodiment, the touch passivation film 158 is made of an inorganic dielectric material, such as $SiN_x$ or $SiO_x$. In one embodiment, the touch passivation film 158 is formed in a thin film shape or a film shape The touch pads 170 are electrically connected to the driving-routing lines 162 and the first and second sensing-routing lines 164 and 166, which are disposed along the side surface of the encapsulation unit 140.

The driving-routing lines 162 extend through the side bezel area BAS and then extend to the lower bezel area BAL, in which the touch pads 170 are disposed. The first sensing-routing lines 164 cross the second touch area TA2 without extending through the upper bezel area BAU and the side bezel area BAS, and then extend to the lower bezel area BAL. In one embodiment, as shown in FIG. 2, the second sensing-routing lines 166 are disposed between the first sensing-routing lines 164 such that the second sensing-routing lines 166 and the first sensing-routing lines 164 are alternately arranged in the lower bezel area BAL. Stated differently, each of the first sensing-routing lines 164 are spaced from another one of the first sensing-routing lines 164 by one of the second sensing-routing lines 166. As a result, the driving-routing lines 162 are disposed in the side bezel area BAS, and the driving-routing lines 162 and the first and second sensing-routing lines 164 and 166 are not disposed in the upper bezel area BAU. Consequently, it is possible to reduce the size of the side bezel area BAS and the upper bezel area BAU. Since the first sensing-routing lines 164 do not bypass the upper bezel area BAU, it is possible to reduce the resistance of the first sensing-routing lines 164. In addition, since the area of the lower bezel area BAL is greater than the area of the upper and side bezel areas BAU and BAS, the increase in the area of the lower bezel area BAL is slight compared to the conventional structure.

In addition, since the distance between the first sensing-routing lines 164 and the touch pads 170 is greater than the distance between the second sensing-routing lines 166 and the touch pads 170, the first sensing-routing lines 164 are longer than the second sensing-routing lines 166, whereby a line resistance difference may occur. For example, the line resistance of the first sensing-routing lines 164 may be greater than the line resistance of the second sensing-routing lines 166.

Figure 6A:
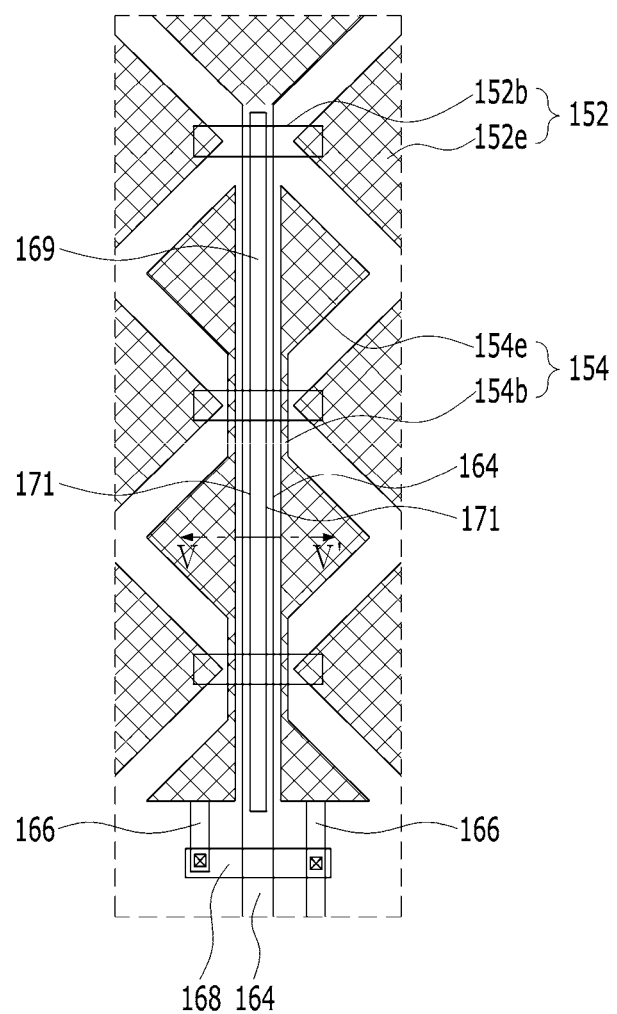
FIGS. 6A and 6B are a plan view and a sectional view, respectively, showing another embodiment of the first sensing routing lines shown in FIG. 4.
Figure 6B:
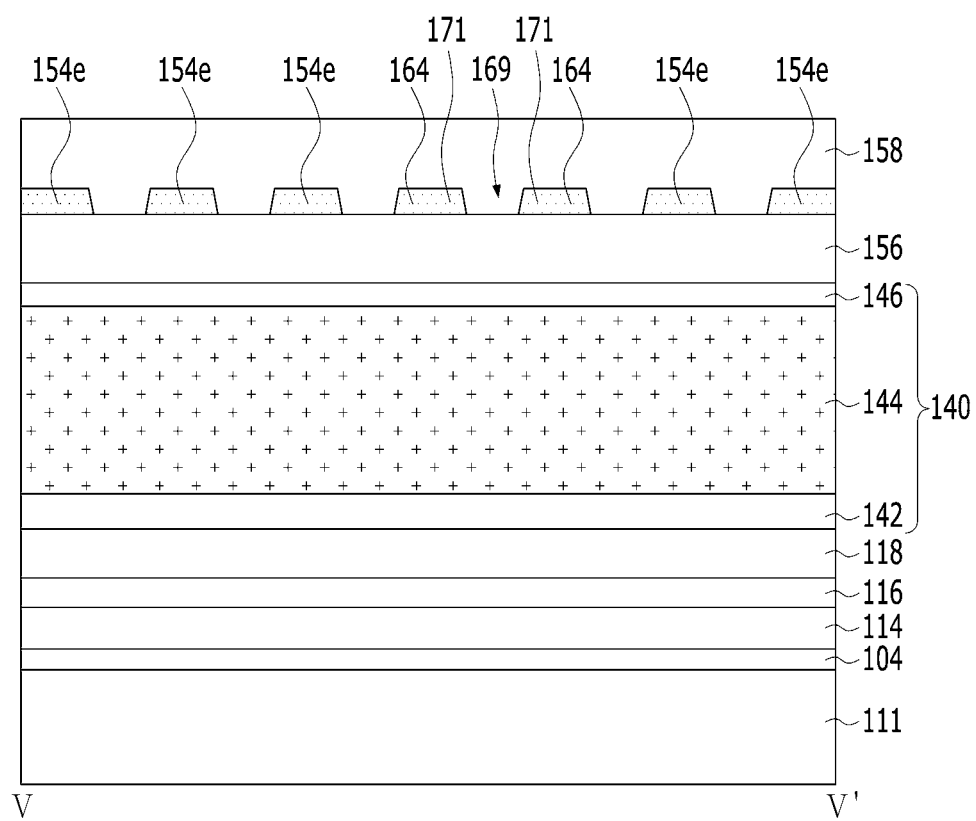

In the present disclosure, therefore, as shown in FIGS. 6A and 6B, a plurality of first sensing-routing lines 164 that cross the second touch area TA2 may be disposed in the same plane (i.e., coplanar) in order to reduce the line resistance of the first sensing-routing lines 164. Consequently, it is possible to reduce the difference in the line resistance between the first and second sensing-routing lines 164 and 166.

FIGS. 6A and 6B are a plan view and a sectional view, respectively, showing another embodiment of the first sensing routing lines shown in FIG. 4. FIG. 6A shows a portion of the plan view of the area A according to another embodiment, and FIG. 6B shows a sectional view of the portion of the plan view of the area A taken along line V-V in FIG. 6A. In contrast to the embodiment shown in FIG. 4, the first sensing-routing lines 164 in FIGS. 6A and 6B include multiple, thinner first sensing-routing lines 164 in the second touch area TA2. Stated differently, each of the first sensing-routing lines 164 includes an opening 169 such that each of the first sensing-routing lines 164 includes multiple first sub-sensing-routing lines 171 in the second touch area TA2. As a result, the line resistance of the first sensing-routing lines 164 are reduced compared to the embodiment shown in FIG. 4. Although the first sensing-routing line 164 shown in FIGS. 6A and 6B include two first sub-sensing-routing lines 171, each of the first sensing-routing lines 164 may include any number of first sub-sensing-routing lines.

Figure 7A:
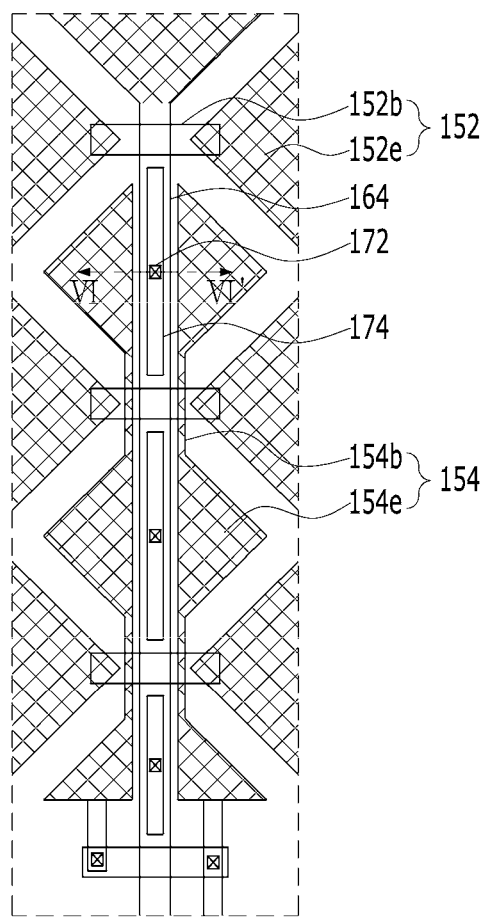
FIGS. 7A and 7B are a plan view and a sectional view, respectively, showing a further embodiment of the first sensing routing lines shown in FIG. 4.
Figure 7B:
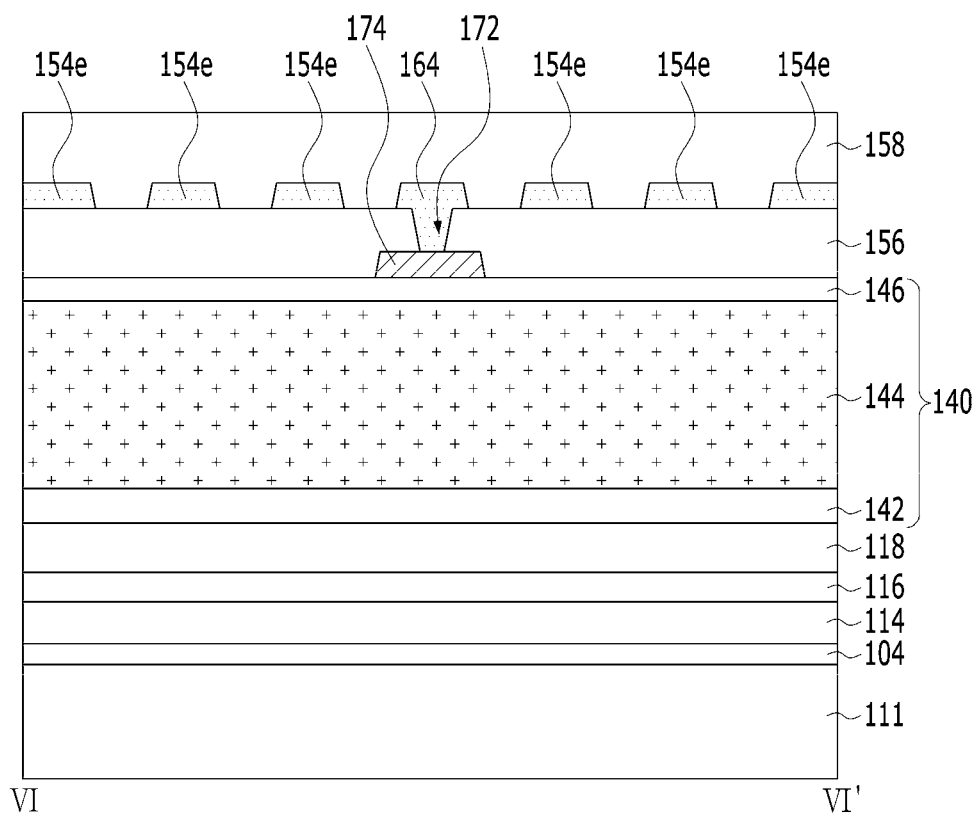

FIGS. 7A and 7B are a plan view and a sectional view, respectively, showing a further embodiment of the first sensing routing lines shown in FIG. 4. FIG. 7A shows a portion of the plan view of the area A according to another embodiment, and FIG. 7B shows a sectional view of the portion of the plan view of the area A taken along line VI-VI in FIG. 7A. As shown in FIGS. 7A and 7B, first sensing-routing lines 164 that cross the second touch area TA2 and auxiliary lines 174 connected to the first sensing-routing lines 164 may be disposed in different layers in order to reduce the line resistance of the first sensing-routing lines 164. For example, the first sensing-routing lines 164 are formed in the same plane as (i.e., coplanar with) the second bridges 154b, and the auxiliary lines 174 are formed in the same plane as (i.e., coplanar with) the first bridges 152b. In one embodiment, the first sensing-routing lines 164 are made of the same material as the second bridges 154b. In one embodiment, the auxiliary lines 174 are made of the same material as the first bridges 152b. In one embodiment, each of the first sensing-routing lines 164 and the auxiliary lines 174 is made of an opaque conductive film having at least one layer of Ti, Al, Mo, MoTi, Cu, or Ta. For example, in one embodiment, each of the auxiliary lines 174 is formed so as to have a stacked three-layer structure, such as Ti/Al/Ti, MoTi/Cu/MoTi, or Ti/Al/Mo.

The auxiliary lines 174, which are disposed in the same plane as the first bridges 152b, are disposed between the first bridges 152b in order to prevent a short circuit with the first bridges 152b. Consequently, adjacent auxiliary lines 174 are disposed so as to be spaced apart from each other in the state in which a corresponding one of the first bridges 152b is disposed therebetween.

The first sensing-routing lines 164, which are formed in the same plane as the second bridges 154b, are electrically connected to the auxiliary lines 174, which are exposed through routing contact holes 172 formed through the touch dielectric film 156. Consequently, the resistance component of the first sensing-routing lines 164, which are disposed between the second touch electrodes 154e and thus have a smaller line width than the second sensing-routing lines 166 and the driving-routing lines 162, is compensated for by the auxiliary lines 174, whereby it is possible to reduce the line resistance of the first sensing-routing lines 164.

Figure 8:
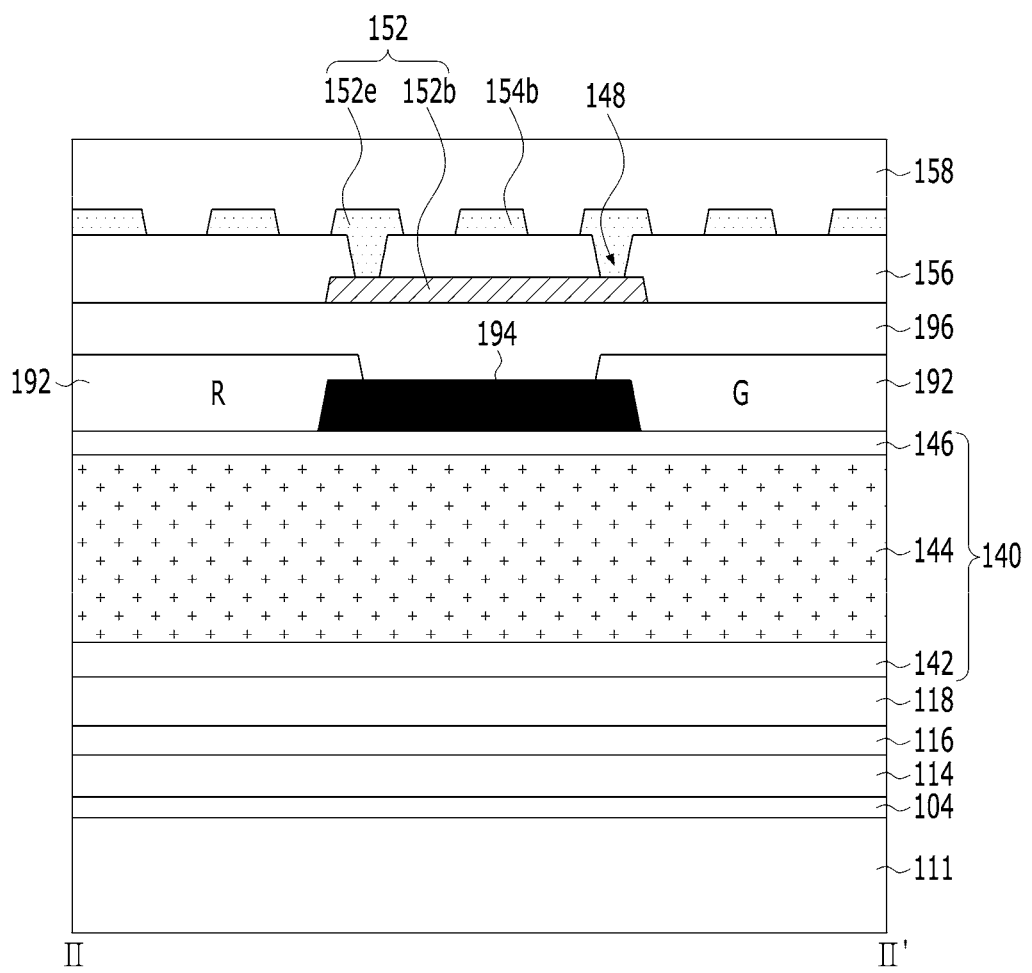
FIG. 8 is a sectional view showing a display device having a touch sensor according to another embodiment of the present disclosure.

FIG. 8 is a sectional view showing an organic light-emitting display device having a touch sensor according to a second embodiment of the present disclosure.

The organic light-emitting display device having the touch sensor shown in FIG. 8 is identical in construction to the organic light-emitting display device shown in FIG. 3, except that a color filter array is further included, and therefore a detailed description of the same elements will be omitted.

The color filter array includes a color filter 192 and a black matrix 194 disposed on the second inorganic encapsulation layer 146 of the encapsulation unit 140. The color filter 192 is formed between the encapsulation unit 140 and each of the touch-sensing line 154 and the touch-driving line 152. The distance between the light-emitting element 120 and each of the touch-sensing line 154 and the touch-driving line 152 is increased by the color filter 192. Consequently, it is possible to minimize the parasitic capacitance formed between the light-emitting element 120 and each of the touch-sensing line 154 and the touch-driving line 152, whereby it is possible to prevent mutual influence due to coupling between light-emitting element 120 and each of the touch-sensing line 154 and the touch-driving line 152. In addition, the color filter 192 may prevent a chemical liquid (e.g., a developing solution or an etching solution), used to manufacture the touch-sensing line 154 and the touch-driving line 152, or external moisture from permeating into the light-emitting stack 124. Consequently, the color filter 192 may prevent damage to the light-emitting stack 124, which has low resistance to a chemical liquid or moisture.

The black matrix 194 is disposed between color filters 192. The black matrix 194 serves to partition respective subpixel areas and to prevent optical interference and screen bleed between adjacent subpixel areas. In one embodiment, the black matrix 194 is made of a high-resistance black dielectric material, or is formed by stacking at least two of red (R), green (G), and blue (B) color filters 192.

A color planarization layer 196 is disposed on the substrate 111, on which the color filter 192 and the black matrix 194 are formed. The substrate 111, on which the color filter 192 and the black matrix 194 are formed, is planarized by the color planarization layer 196. Stated differently, the color planarization layer 196 provides a planar surface for the touch dielectric film 156 and the first bridges 152b.

In addition, although a structure in which the touch electrodes 152e and 154e are disposed above the color filter 192 has been described by way of example with reference to FIG. 8, the color filter 192 may be disposed above the touch electrodes 152e and 154e. In this case, the touch electrodes 152e and 154e are disposed between the color filter 192 and the encapsulation unit 140.

In addition, although the light-emitting element 120 and the pixel-driving unit are not shown in FIGS. 5A to 5C, 6, 7B, and 8, a plurality of light-emitting element 120 and pixel-driving units may be disposed under the touch sensor 100, as shown in FIG. 3.

As is apparent from the above description, in the present disclosure, the display area is spatially divided into the first and second touch areas, and the first sensing-routing lines, connected to the touch electrodes in the first touch area, are disposed so as to cross the second touch area. In the present disclosure, the first sensing-routing lines, connected to the touch electrodes in the first touch area, and the second sensing-routing lines, connected to the touch electrodes in the second touch area, are not disposed in the side and upper bezel areas, but are alternately disposed in the lower bezel area. In the present disclosure, therefore, it is possible to reduce the size of the side bezel area and the upper bezel area.

It will be apparent to those skilled in the art that various modifications and variations can be made in the present disclosure without departing from the spirit or scope of the disclosure. Thus, it is intended that the present disclosure covers the modifications and variations of the various embodiments described herein provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a plurality of pads in a bezel area;
a plurality of rows of touch electrodes in a first touch area; and
a plurality of columns of touch electrodes, each of the plurality of columns of touch electrodes including a first set of touch electrodes in the first touch area, a second set of touch electrodes in a second touch area, and a third set of touch electrodes in the second touch area, the first set of touch electrodes being electrically connected to a first pad of the plurality of pads, the second set of touch electrodes and the third set of touch electrodes being electrically connected to a second pad of the plurality of pads.

2. The device of claim 1, further comprising a routing line positioned between the second set of touch electrodes and the third set of touch electrodes, wherein the first set of touch electrodes is electrically connected to the first pad via the routing line.

3. The device according to claim 2, further comprising a first sensing routing line and second sensing routing lines, wherein the plurality of pads include a first pad and a second pad, the first pad being electrically connected to the routing line via the first sensing routing line and the second pad being electrically connected to the second sensing routing lines,
wherein the first touch area is spaced from the touch pads by the second touch area.

4. The device according to claim 3, further comprising first bridges and second bridges,
wherein columns of the first set of touch electrodes, the second set of touch electrodes and the third set of touch electrodes are electrically connected to each other via the first bridges,
wherein the rows of touch electrodes are electrically connected to each other via the second bridges,
wherein the routing lines are in the second touch area, and the first sensing routing lines and the second sensing routing lines are in the bezel area.

5. The device according to claim 4, further comprising a touch dielectric film, wherein the routing lines overlap the first bridges disposed, and the touch dielectric film is disposed between the routing lines and the first bridges.

6. The device according to claim 5, wherein the first routing lines are made of a same material as either the second set of touch electrodes or the third set of touch electrodes, and are on a same layer as the second set of touch electrodes and the third set of touch electrodes.

7. The device according to claim 5, further comprising auxiliary lines and routing contact holes, wherein the auxiliary lines are made of a same material as the first bridges and are on a same layer as the first bridges, and the routing lines extend through the routing contact holes formed through the touch dielectric film and contact the auxiliary lines.

8. The device according to claim 4, wherein
each of the second set of touch electrodes is substantially symmetrical to one of the third set of touch electrodes with respect to one of the routing lines, and
each of the second bridges is substantially symmetrical to one of the second bridges with respect to one of the routing lines.

9. The device according to claim 4, wherein
each of the second set of touch electrodes and the third set of touch electrodes in the second touch area have a shape corresponding to half of a shape of one of the first set of touch electrodes disposed in the first touch area, and
each of the routing lines extends between the second set of touch electrodes and the third set of touch electrodes in the second touch area and between at least two of the second bridges in the second touch area.

10. The device according to claim 2, wherein the routing lines that extend through the second touch area have substantially the same length in the second touch area.

11. The device according to claim 1, wherein at least one of the first set of touch electrodes, the second set of touch electrodes, and the third set of touch electrodes has a mesh shape.

* * * * *